United States Patent [19]

Kernahan et al.

[11] Patent Number: 5,666,659
[45] Date of Patent: Sep. 9, 1997

[54] METHOD OF AND STRUCTURE FOR INCREASING SIGNAL POWER OVER CELLULAR LINK

[76] Inventors: Kent Kernahan, 10581 Madera, Cupertino, Calif. 94016; Gavin Grant, 1405 McDaniel Ave., San Jose, Calif. 95126

[21] Appl. No.: 404,622

[22] Filed: Mar. 13, 1995

[51] Int. Cl.$^6$ .................. H04B 1/40; H04B 1/02
[52] U.S. Cl. .................. 455/43; 455/72; 455/116
[58] Field of Search .................. 455/43, 72, 116, 455/33.1; 375/222

[56] References Cited

U.S. PATENT DOCUMENTS

| | | |
|---|---|---|
| 4,539,707 | 9/1985 | Jacobs et al. .................. 445/116 |
| 5,226,178 | 7/1993 | Eastmond et al. .................. 455/72 |
| 5,386,590 | 1/1995 | Dolan .................. 455/43 |
| 5,507,033 | 4/1996 | Dolan .................. 455/43 |

*Primary Examiner*—Chi H. Pham
*Attorney, Agent, or Firm*—Skjerven, Morrill, MacPherson, Franklin and Friel; Alan H. MacPherson

[57] ABSTRACT

The clipper contained in the standard cellular transceiver used in cellular telephone networks is effectively prevented from having any effect on a signal by reducing the signal amplitude so that the signal which passes through the clipper does not activate the clipper. The signal from the clipper is then re-amplified prior to being passed to the modulator for transmission over the airwaves. The signal power is further increased by adding a selected de-emphasis circuit to the system prior to the transmitter, the de-emphasis circuit causing the frequency components of the signal to decline in amplitude as a function of frequency by a selected amount, 6 dB per octave in one embodiment.

9 Claims, 1 Drawing Sheet

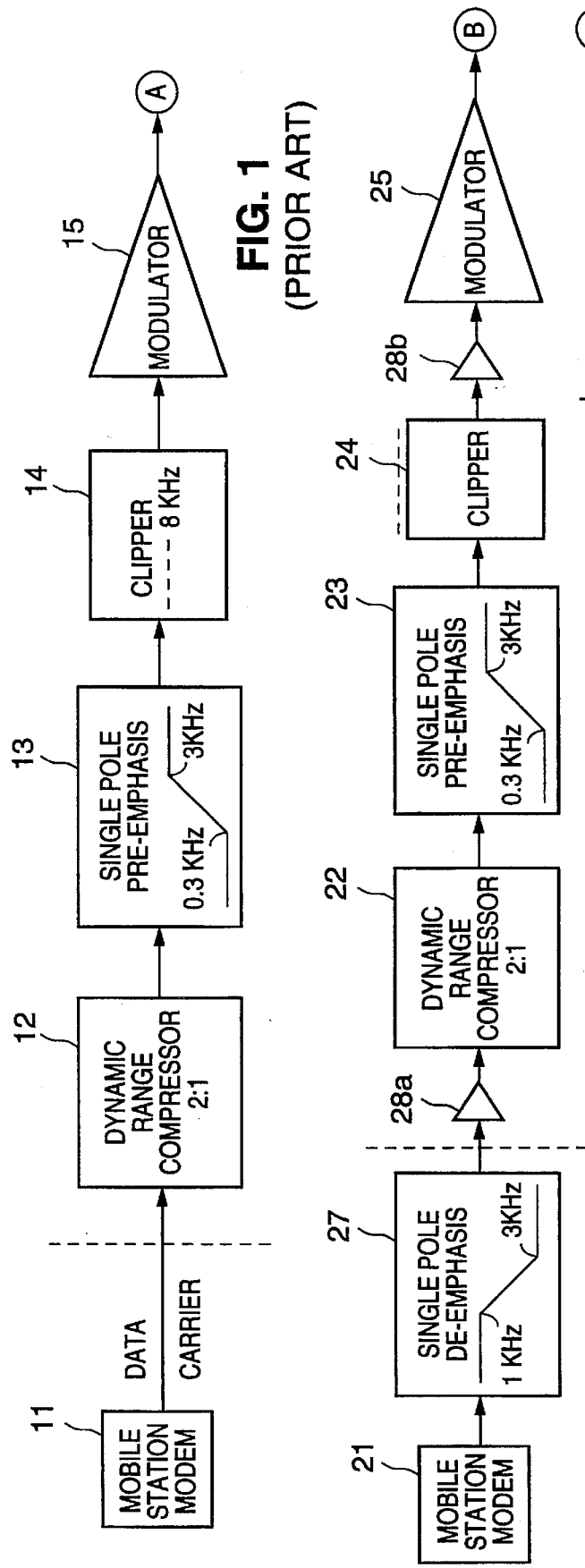
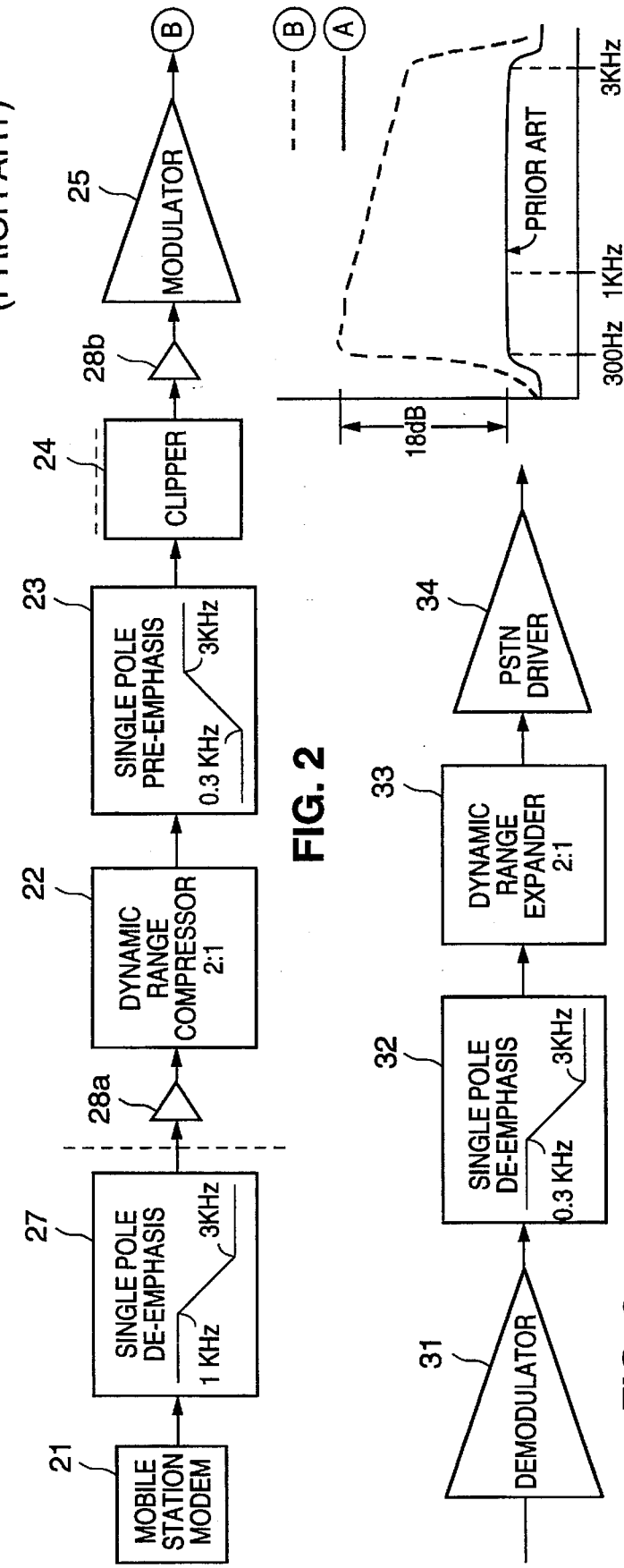
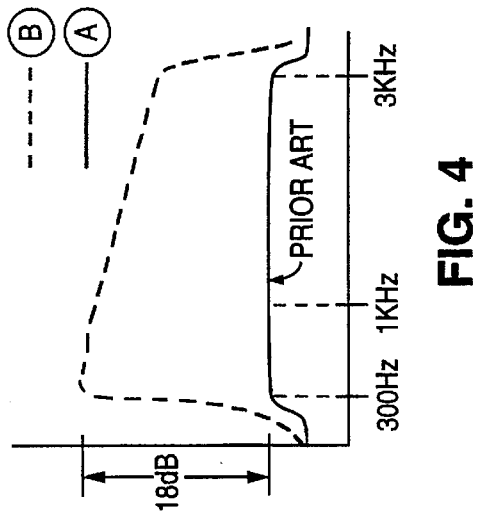

METHOD OF AND STRUCTURE FOR INCREASING SIGNAL POWER OVER CELLULAR LINK

FIELD OF THE INVENTION

This invention relates to a mobile station modem, its interface to a cellular radio transmitter, and to structures and methods for increasing the power of a data signal transmitted over a cellular phone system's radio transmitter.

BACKGROUND

A cellular radio transmitter transmits data to a cellular base station. The cellular base station transfers this data to the public switched telephone network ("PSTN") which ultimately is coupled to a host modem. One problem with the prior art (as shown in FIG. 1; see also U.S. Pat. No. 5,386,590) is that within the cellular transceiver there are the following components:

1. a dynamic range compressor 12;
2. an input pre-emphasis circuit 13; and
3. a clipper or limiter circuit 14.

The signal output from the clipper circuit 14 is modulated by modulator 15 onto a carrier signal and transmitted over the air. The pre-emphasis circuit 13 and the dynamic range compressor 12 do not actually represent a source of distortion in and of themselves in that in the base station radio receiver (FIG. 3) they are compensated by a de-emphasizer 32 and a dynamic range expander 33. However, the function of the clipper circuit 14 is to actually destroy information; that is, clipper circuit 14 removes signal peaks that are above a pre-defined limit and thereby actually removes information from the mobile station modem carrier signal. When data is being transmitted, the destruction of information is unacceptable.

SUMMARY OF THE INVENTION

In accordance with this invention, the amplitude of the input signal to the clipper circuit is reduced and the amplitude of the output signal from the clipper circuit is increased such that the signal to be transmitted by the mobile station radio (in accordance with this invention called the "mobile data station", which is a combination of a modem and the cellular data station) is not clipped by the clipper circuit.

This invention effectively eliminates the effect of the clipper circuit from the mobile data station.

Effectively eliminating the clipper circuit from the mobile data station allows the mobile data station to generate a signal amplitude corresponding to up to 12 KHz modulation in an FM modulated carrier signal. 12 KHz is the FCC limit on maximum FM modulation in an advanced mobile phone system (FCC PT 22 STD). This provides an immediate benefit in terms of signal power delivered to the land line modem by the base station because the normal clipper setting is far enough removed from the FCC limits that the signal power delivered to the land line modem can be roughly doubled.

In a spectrally flat modem carrier signal passed through a pre-emphasis circuit, only the high frequency components would have a maximum amplitude. Intermediate frequency components would have lower amplitudes and therefore a lower signal-to-noise ratio on the RF carrier. Since the maximum modulation would be set for only the highest frequency components, the signal power for the entire spectrum would be reduced from what it would be if all frequency components were maximumly modulated. In accordance with this invention, an increase in signal power is achieved by adjusting the spectrum of the modem carrier signal such that the lower frequency components are increased in amplitude relative to the higher frequency components. Such a spectrum appears flat after pre-emphasis and therefore has equal amplitudes for all frequency components. While the amplitudes for the highest frequency components are unchanged in this invention, the amplitudes of all other frequency components are increased thereby increasing the total signal power. If the pre-emphasis circuit contained in the mobile station transmitter was completely compensated for by a de-emphasis circuit of exactly equal magnitude, essentially uniform energy would be provided over the spectrum of the signal transmitted over the air and in theory the maximum modulated power would be delivered over the wireless medium. The problem is that at the base station receiver, the de-emphasis circuit incorporated in the receiver then would decrease the signal amplitude as frequency went from low to high (i.e. the high frequencies would be greatly de-emphasized) at about 6 dB per octave. Taken to the extreme, if the amplitude of the frequency spectrum was made exactly flat, then an entire decade of frequency response, that is, from 300 Hz to 3 KHz, would have a flat amplitude spectrum. After de-emphasis by the receiver, this would be about a 20 dB decrease in high frequency (3 KHz) amplitude from the low frequency (0.3 KHz) amplitude. Thus although the signal power over the air is increased, the signal power delivered to the land line modem at high frequencies has been dramatically reduced. These high frequencies are the frequencies that are most subject to attenuation by the public switched telephone network. With the 20 dB dynamic range essentially occupied by this signal over the frequency spectrum from 0.3 KHz to 3 KHz, the limit of what a normal host modem would be able to resolve is being approached in that the high frequency components of the signal may be attenuated to below the noise level or the dynamic range occupied by the signal may be too large for the host modem to resolve.

So basically if a system uses a PSTN with local attenuation to receive a data signal and transmit the data signal onto a host modem, the system will fail because the system has exceeded the ability of the host modem to equalize the input signal and in fact, even to resolve the high frequency components of the input signal. So what is needed is a compromise. One compromise in accordance with this invention is to use a de-emphasis circuit which begins the compensation at the 1 KHz mark. This provides essentially for an equal amount of spectrum in octaves on either side of the 1 KHz frequency (i.e. the band-width of the signal ranges from 300 Hz to 3 KHz). Since roll-off of a single pole filter is specified in dB per octaves, with 6 dBs per octave for a normal one pole filter, the same amount of spectrum exists in the frequency range from 300 Hz to 1 KHz, that is approximately 1.5 octaves, as exists in the frequency range from 1 KHz to 3 KHz (exactly 1.5 octaves). The total attenuation in accordance with this invention in terms of the high frequency components is about 9 dB and also the total dynamic range over the frequency spectrum from 1 KHz to 3 KHz occupied by this change in frequency response is 9 dB. Graphically, the system of this invention provides a flat response from 300 Hz out to 1 KHz, then 9 dB of attenuation from 1 KHz out to 3 KHz.

An alternative embodiment uses a programmable digital filter which will provide partial compensation over the entire frequency spectrum of the signal beginning at 0.3 KHz. The roll off preferably is 3 dB per octave (instead of 6 dB per octave) in this alternative embodiment. Because the roll off starts at the beginning of the frequency response curve (0.3 KHz) the result is a more uniform amplitude attenuation as a function of frequency. This reduces the computational load for the receiver equalizer.

This invention basically removes the limiter (i.e. clipper circuit 14 in FIG. 1) which was a cause of distortion and then partially compensates for the pre-emphasis circuit (circuit 13 in FIG. 1) of the cellular transmitter to increase the delivered signal power. The result is to deliver a much higher audio power to the host modem and to provide a significant improvement over the prior art signal power delivered to the host modem.

The invention will be more fully understood in conjunction with the following detailed description taken together with the drawings.

DESCRIPTION OF THE DRAWINGS

FIG. 1 shows a prior art mobile station modem and radio;

FIG. 2 shows a mobile data station 20 in accordance with this invention including a radio for transmission of a data signal over the airwaves;

FIG. 3 illustrates a base station for receipt of a transmitted data signal from a mobile station modem 11 of the type shown in FIG. 1 or from a mobile data station 20 of the type shown in FIG. 2, the base station being of the type suitable for providing a signal on the public switched telephone network; and FIG. 4 illustrates the amplitude spectrum of the output signal from the amplifier 34 in the base station of FIG. 3 for signals from both the prior art mobile station modem and radio 10 of FIG. 1 and the mobile data station 20 of FIG. 2.

DETAILED DESCRIPTION

The following description is illustrative only and not limiting. Other embodiments of this invention will be obvious to those skilled in the cellular phone network and mobile station modem arts in view of this description.

FIG. 1 shows a prior art combination of a mobile station modem 11 interfaced to the audio processing section of the cellular transmitter used in a cellular transceiver. Modem 11 transmits data over a data carrier directly to a dynamic range compressor 12 which is shown in FIG. 1 as having a two-to-one compression ratio. Compressor 12 is a dynamic range compressor as opposed to a compander as is normally used in telephone applications. Compressor 12 is essentially a weak AGC circuit which has controllable gain with an attack time that is much shorter (i.e. faster) than its decay time. Compressor 12 basically sets a fixed gain for an input signal with a fixed dynamic range amplitude but does not actually compress and act upon each point in that input signal as opposed to for example, a μlaw or an A law compander commonly used in telephone equipment. Since the mobile station modem 11 is providing a fixed dynamic range signal, with or without any kind of follow-on audio processing, the dynamic range compressor 12 will attain and remain at a specific gain over the base band and stay there. Following the dynamic range compressor 12, single pole pre-emphasis circuit 13 adds pre-emphasis (i.e. increases the amplitude of the signal) at 6 dB per octave over the voice band from 0.3 KHz to 3 KHz. Following pre-emphasis circuit 13 is a clipping circuit 14. Clipping circuit 14 in most voice applications is set to begin to attack the signal—that is to begin to remove information from the signal—at a signal amplitude corresponding to approximately 8 KHz of FM modulation, but this varies from manufacturer to manufacturer. However, clipper 14 is specifically set normally with first a soft clipping which causes distortion and then a hard clipping which basically removes all of the signal above a certain magnitude so that a quick dynamic range pop on the input signal will not cause the FM modulation required to transmit the high amplitude signal to exceed the FCC limits. The FCC FM modulation limit for this path is 12 KHz. FM modulator 15 is a standard modulator of well-known design.

FIG. 2 shows one embodiment of the invention. Blocks in FIG. 2 corresponding to blocks of FIG. 1 are similarly numbered; that is, mobile station modem 21 is the counterpart to mobile station modem 11, dynamic range compressor 22 is the counterpart to dynamic range compressor 12, pre-emphasis circuit 23 is the counterpart to pre-emphasis circuit 13, clipper 24 is the counterpart to clipper 14 and modulator 25 is the counterpart to modulator 15. However, in accordance with this invention, attenuator 28a and amplifier 28b are added to the circuit of FIG. 2 to effectively remove clipper 24 from the circuit. In reality, clipper 24 remains in the circuit but has no effect on the signal being processed. In addition, an additional circuit block 27, which de-emphasizes the signal, is added to allow a further increase in signal power. The additional block 27 is a selective de-emphasis circuit 27 of well-known single pole design set with one corner at approximately 1 KHz. The signal from de-emphasis circuit 27 is the input signal to dynamic range compressor 22 (shown as a two-to-one compressor). Compressor 22 will not compress the dynamic range of this single pole filter 27 because compressor 22 is not a compander circuit; compressor 22 will simply obtain perhaps a slightly different gain but the roll off of the mobile station carrier (which is essentially a constant dynamic range signal) will stay the same. This means that the selective de-emphasis circuit 27 partially compensates the pre-emphasis circuit 23 in the cellular transceiver.

The pre-emphasis circuit 23 in the cellular transceiver in fact has a characteristic gain of 6 dB per octave over the frequency range of 0.3 KHz to 3 KHz to partially match the 6 dB per octave drop of the single pole de-emphasis circuit 27 that has a roll-off of 6 db per octave beginning at a corner frequency of 1 KHz and extending to at least 3 KHz.

Although it is not essential to this invention to exactly compensate for the 6 dB per octave pre-emphasis circuit 23, for convenience in the above described embodiment of the invention a single pole filter 27 (of well-known design) was used which has a 6 dB per octave roll-off characteristic. In other implementations of this invention, the filter 27 can be implemented in the mobile station modem 21 using a digital filtering technique to achieve a uniform attenuation of approximately 3 dB per octave over the entire voice band from 0.3 KHz to 3 KHz as opposed to the characteristics of filter 27 in FIG. 2 which has essentially a break point at 1 KHz and then a 6 dB per octave attenuation over the voice band up to 3 KHz. In accordance with this invention, it is not necessary to completely compensate for the pre-emphasis circuit 23 over the entire frequency range from 0.3 KHz to 3 KHz. In fact, complete compensation, if done, would result in a very large dynamic range requirement at the public switched telephone network (PSTN) of about 20 dB for the signal in addition to the high frequency attenuation common to the public switched telephone network. For example, in a long rural telephone loop, the high frequency attenuation would probably render the signal unusable.

Single pole pre-emphasis circuit 23 in FIG. 2 is followed by clipper circuit 24. In accordance with this invention, the transceiver in FIG. 2 uses an amplifier 28a which attenuates the output signal from de-emphasis circuit 27 such that the effective clipping threshold of clipper 24 is actually above the FCC limitations for FM modulation. An additional amplifier 28b following clipper circuit 24 amplifies the output signal from clipper 24 to compensate for the attenuation introduced into the signal by amplifier 28a and dynamic range compressor 22. The circuit of this invention ensures that the FCC limitations for modulation are not exceeded by aligning the modulation amplitude of the constant amplitude carrier signal from the constant amplitude modem to the specific radio transceiver modulator to achieve an FM modulation at modulator 25 which is below the 12 KHz maximum allowed by FCC regulations or whatever limit might be applied should this invention be used in other applications besides a cellular service.

This invention is shown as used with an FM radio transmitter and the limitations on frequency excursions in FM modulation are the equivalent of amplitudes. That is to say, a 12 KHz deviation of an FM modulated carrier signal is equivalent to some amplitude variation of an amplitude modulated carrier signal and does not reflect the frequency response of the input base band signal, i.e., the signal coming from the mobile station modem.

The modulator in both the prior art and the current invention then would drive an FM modulated carrier signal by using a voltage control oscillator or some other means of transferring the amplitude signal onto the frequency spectrum of the RF carrier signal. The modulated signal would then be transmitted to the base station radio receiver which is shown in FIG. 3. At the base station radio receiver, the modulated signal would go through RF amplification, using well known circuitry (not shown) and eventually arrive at the demodulator 31 where the signal would be converted back into an amplitude varying base band signal. This amplitude varying base band signal would then pass through the de-emphasis circuit 32, which in the cellular service is designed to exactly compensate for pre-emphasis circuit 23 (FIG. 2) in the present invention and pre-emphasis circuit 13 (FIG. 1) in the prior art. The received signal then would pass through dynamic range expander 33 which has basically the reverse response of the dynamic range compressor 22 in the circuit of this invention and compressor 12 in the prior art. The signal is then driven onto the public switched telephone network by PSTN driver 34, which includes a series of well-known circuits and components such as amplifiers, interface circuits and transformers to interface the signal ultimately to the PSTN and then to a host modem.

FIG. 4 shows the relative difference in signal amplitudes between the prior art which shows a flat frequency response at one gain and the present invention which shows the possible gain in signal power with a corresponding degradation in frequency response; that is, the frequency response is no longer uniform as a function of frequency due to the de-emphasis circuit 32 in the base station. To briefly explain the components of the gain, if the clipper 24 (FIG. 2) was set at 8 KHz as in the prior art, the non-clipped signal could be adjusted to exactly 12 KHz (this would allow a maximum amount of gain to be achieved), then the ratio (1.5) of those two signals, that is 12 KHz divided by 8 KHz is the improvement in actual modulated power that the circuit of this invention would transmit. However, there is a two-to-one expander 33 in the base station which will then multiply the difference in the amplitude of these two signals by a factor of two; that is, expander 33 provides a gain of two-to-one in the dynamic range. So the signal power is actually increased by a factor of three (1.5 ×2) by the present invention. The additional drive power that is achieved by cutting the high frequency amplitude by 9 dB with de-emphasis circuit 27 (FIG. 2), means that a corresponding 9 dB in signal amplitude can be added on top of the factor of three amplitude increase already achieved. The factor of three gain in signal amplitude is about 9.5 dB. This 9.5 dB Coupled with the 9 dB gained from the de-emphasis circuit 27 gives a total improvement of signal amplitude in the low frequencies of about 18 dB up through the 1 KHz point where attenuation begins and at the highest frequency, a gain of about 9 dB derived entirely from the improved modulation range. This results in an aggregate signal power that is much greater than would have been achievable without the invention.

In conclusion, this invention eliminates the function of clipper 24 and partially compensates the pre-emphasis circuit 13 of the prior art. Typically, this invention effectively reduces the signal amplitude so that although the signal passes through the clipper 24, the clipper circuit 24 has no effect on the signal. By actually having a small amount of pre-emphasis coming from the mobile station modem, there is no need for pre-emphasis circuit 23 in the transmitter path for the data. In essence, clipper 24, pre-emphasis circuit 23 and de-emphasis circuit 27 can be eliminated and replaced by a circuit which provides a slight pre-emphasis, for example in the mobile station modem 21. This slight pre-emphasis would be typically around 3 dB per octave amplitude increase. The result is a de-emphasized signal coming out of the base station rolling off at about 3 dB per octave. So a small pre-emphasis circuit is placed in the transmit path and the clipper circuit is effectively removed or bypassed.

The result is to obtain the maximum power level at the host modem which is typically in the land line telephone system.

In accordance with the invention, more signal power is achieved by a combination of a de-emphasis circuit 27 (which reduces the amplitude of the higher frequency components in the voice signal) and a dynamic range compressor 22 which does a two-to-one compression, followed by a pre-emphasis circuit 23 which increases the amplitude of the higher frequency components so as to give to the signal a flat or relatively flat frequency spectrum from about 1 KHz on up to the top of the voice band frequency range, typically 3 KHz. Having then a relatively flat frequency spectrum for the signal to be transmitted, the modulator is able to amplify and modulate the signal to produce maximum signal power on the radio link. This then ensures that the signal-to-noise ratio on the radio link is maximized. The receiver, which includes demodulator 31, then demodulates the signal and the signal so demodulated is passed through a de-emphasis circuit 32 (which is optional and is actually not necessary) which results in an output signal which has a relatively flat frequency spectrum from about 300 Hz to 1 KHz and which then rolls off at 6 dB per octave up to 3 KHz. Ideally, however, the de-emphasis circuit 32 can be removed to give an output signal with a relatively flat amplitude as a function of frequency from 300 Hz to 3 KHz.

What is claimed is:

1. In combination;

means for providing a signal capable of carrying data or voice, said signal occupying the voice band frequency range;

a de-emphasis circuit for attenuating the frequency components of said signal above a first selected corner frequency;

a first amplifier for selectively attenuating selected frequency components of said signal;

a pre-emphasis circuit for selectively amplifying selected frequency components of said signal above a second selected corner frequency; and a second amplifier for increasing the amplitude of selected signal components in said signal;

thereby to provide a signal to a modulator having increased signal power compared to prior art signals.

2. The combination in claim 1 including a clipper circuit, wherein said first and second amplifiers effectively eliminate the clipper circuit from having any effect on said signal.

3. The combination in claim 1 wherein said de-emphasis circuit has a low corner frequency of approximately 1 KHz.

4. The combination in claim 1 wherein said pre-emphasis circuit has a low corner frequency of 0.3 KHz.

5. In combination, a cellular data transmitter for transmitting a signal, said transmitter including a first amplifier for attenuating the signal;

a clipper circuit for receiving the signal from the first amplifier; and a second amplifier for amplifying the signal from the clipper circuit;

whereby the first amplifier in combination with the second amplifier effectively prevent the clipper circuit from having any effect on the signal.

6. The transmitter of claim 5 wherein the signal is a data signal.

7. The transmitter as in claim 5 including a de-emphasis circuit for causing the frequency components of the signal to decrease in amplitude as a function of increase in frequency at a selected number of decibels per octave; and a pre-emphasis circuit for causing the frequency components of the signal to increase in amplitude at a second selected number of decibels per octave.

8. The transmitter as in claim 7 wherein the de-emphasis circuit has a first corner frequency and the pre-emphasis circuit has a first corner frequency, the first corner frequency of the pre-emphasis circuit being lower in value than the first corner frequency of the de-emphasis circuit.

9. The method of effectively removing a clipper circuit from the transmitter associated with a cellular telephone network which includes attenuating the signal to be passed through the clipper circuit;

passing the signal through the clipper circuit, the attenuation being such that the clipper circuit does not remove information from the signal, even for the maximum amplitude of the signal, and amplifying the output signal from the clipper circuit, thereby to effectively prevent the clipper circuit from having any effect on the signal.

\* \* \* \* \*